(12) United States Patent
Ren et al.

(10) Patent No.: US 11,062,942 B2
(45) Date of Patent: Jul. 13, 2021

(54) METHODS FOR CONTROLLABLE METAL AND BARRIER-LINER RECESS

(71) Applicant: Micromaterials LLC, Wilmington, DE (US)

(72) Inventors: He Ren, San Jose, CA (US); Amrita B. Mullick, Santa Clara, CA (US); Regina Freed, Los Altos, CA (US); Mehul Naik, San Jose, CA (US); Uday Mitra, Cupertino, CA (US)

(73) Assignee: Micromaterials LLC, Wilmington, DE (US)

( * ) Notice: Subject to any disclaimer, the term of this patent is extended or adjusted under 35 U.S.C. 154(b) by 65 days.

(21) Appl. No.: 16/214,522

(22) Filed: Dec. 10, 2018

(65) Prior Publication Data

US 2019/0198389 A1    Jun. 27, 2019

Related U.S. Application Data

(60) Provisional application No. 62/596,113, filed on Dec. 7, 2017.

(51) Int. Cl.
*H01L 21/768* (2006.01)

(52) U.S. Cl.
CPC .... *H01L 21/76849* (2013.01); *H01L 21/7685* (2013.01); *H01L 21/76814* (2013.01);
(Continued)

(58) Field of Classification Search
CPC ......... H01L 21/76814; H01L 21/76883; H01L 21/76865; H01L 21/76829;
(Continued)

(56) References Cited

U.S. PATENT DOCUMENTS

| 4,671,970 A | 6/1987 | Keiser et al. |
| 5,824,597 A | 10/1998 | Hong |

(Continued)

FOREIGN PATENT DOCUMENTS

| JP | 2008108757 A | 5/2008 |
| JP | 2011060803 A | 3/2011 |

(Continued)

OTHER PUBLICATIONS

PCT International Search Report and Written Opinion in PCT/US2017/037141 dated Aug. 31, 2017, 11 pages.

(Continued)

*Primary Examiner* — Michael M Trinh
(74) *Attorney, Agent, or Firm* — Servilla Whitney LLC

(57) ABSTRACT

Methods of etching a metal layer and a metal-containing barrier layer to a predetermined depth are described. In some embodiments, the metal layer and metal-containing barrier layer are formed on a substrate with a first dielectric and a second dielectric thereon. The metal layer and the metal-containing barrier layer formed within a feature in the first dielectric and the second dielectric. In some embodiments, the metal layer and metal-containing barrier layer can be sequentially etched from a feature formed in a dielectric material. In some embodiments, the sidewalls of the feature formed in a dielectric material are passivated to change the adhesion properties of the dielectric material.

8 Claims, 3 Drawing Sheets

(52) U.S. Cl.
CPC .. *H01L 21/76825* (2013.01); *H01L 21/76826* (2013.01); *H01L 21/76829* (2013.01); *H01L 21/76831* (2013.01); *H01L 21/76834* (2013.01); *H01L 21/76865* (2013.01); *H01L 21/76883* (2013.01); *H01L 21/76897* (2013.01)

(58) Field of Classification Search
CPC ......... H01L 21/76831; H01L 21/76826; H01L 21/76825
See application file for complete search history.

(56) References Cited

U.S. PATENT DOCUMENTS

| | | | |
|---|---|---|---|
| 6,130,151 A | 10/2000 | Lin et al. | |
| 6,143,653 A | 11/2000 | Tsai et al. | |
| 6,528,884 B1 | 3/2003 | Lopatin et al. | |
| 6,576,113 B1 | 6/2003 | Scherer et al. | |
| 6,653,200 B2 | 11/2003 | Olsen | |
| 7,192,803 B1 | 3/2007 | Lin et al. | |
| 7,279,119 B2 | 10/2007 | Hellring et al. | |
| 7,288,463 B1 | 10/2007 | Papasouliotis | |
| 7,541,297 B2 | 6/2009 | Mallick et al. | |
| 7,605,082 B1* | 10/2009 | Reid | C23C 18/1607 257/E21.076 |
| 7,985,977 B2 | 7/2011 | Gogoi et al. | |
| 8,034,705 B2 | 10/2011 | Choi et al. | |
| 8,338,225 B2 | 12/2012 | Breitwisch et al. | |
| 8,575,753 B2 | 11/2013 | Choi et al. | |
| 8,951,429 B1 | 2/2015 | Liu et al. | |
| 9,012,322 B2 | 4/2015 | Duong et al. | |
| 9,117,884 B1 | 8/2015 | Shaviv et al. | |
| 9,236,292 B2 | 1/2016 | Romero et al. | |
| 9,312,220 B2 | 4/2016 | Lu et al. | |
| 9,324,650 B2 | 4/2016 | Edelstein et al. | |
| 9,362,165 B1 | 6/2016 | Bouche et al. | |
| 9,362,413 B2 | 6/2016 | Yu et al. | |
| 9,368,395 B1 | 6/2016 | Wei et al. | |
| 9,490,202 B2 | 11/2016 | Lin et al. | |
| 9,666,451 B2 | 5/2017 | Wallace et al. | |
| 9,679,781 B2 | 6/2017 | Abatchez et al. | |
| 9,721,888 B2 | 8/2017 | Chang et al. | |
| 9,837,314 B2 | 12/2017 | Smith et al. | |
| 10,083,834 B2 | 9/2018 | Thompson et al. | |
| 10,319,604 B2 | 6/2019 | Duan et al. | |
| 10,319,636 B2 | 6/2019 | Basu et al. | |
| 2002/0098642 A1 | 7/2002 | Harris et al. | |
| 2002/0163081 A1 | 11/2002 | Aoyama | |
| 2003/0143862 A1 | 7/2003 | Iyer | |
| 2004/0067649 A1 | 4/2004 | Hellring et al. | |
| 2004/0192034 A1 | 9/2004 | Ohiwa et al. | |
| 2005/0121768 A1 | 6/2005 | Edelstein et al. | |
| 2005/0167846 A1 | 8/2005 | Aoyama | |
| 2005/0266627 A1 | 12/2005 | Furukawa et al. | |
| 2006/0169576 A1 | 8/2006 | Brown et al. | |
| 2006/0286806 A1 | 12/2006 | Ohkuni et al. | |
| 2007/0166981 A1 | 7/2007 | Furukawa et al. | |
| 2007/0199922 A1 | 8/2007 | Shen et al. | |
| 2008/0160783 A1 | 7/2008 | Watanabe et al. | |
| 2008/0182411 A1 | 7/2008 | Elers | |
| 2008/0242097 A1 | 10/2008 | Boescke et al. | |
| 2009/0017631 A1 | 1/2009 | Bencher | |
| 2009/0072409 A1 | 3/2009 | Nitta et al. | |
| 2009/0174040 A1 | 7/2009 | Gogoi et al. | |
| 2009/0269569 A1 | 10/2009 | Fucsko et al. | |
| 2009/0321931 A1* | 12/2009 | Lee | H01L 21/76883 257/741 |
| 2010/0078617 A1 | 4/2010 | Breitwisch et al. | |
| 2010/0096691 A1 | 4/2010 | Shin et al. | |
| 2010/0171220 A1 | 7/2010 | Cheng-Lin | |
| 2010/0173494 A1 | 7/2010 | Kobrin | |
| 2010/0203725 A1 | 8/2010 | Choi et al. | |
| 2010/0301480 A1 | 12/2010 | Choi et al. | |
| 2010/0330805 A1 | 12/2010 | Doan et al. | |
| 2011/0049568 A1 | 3/2011 | Lochtefeld et al. | |
| 2011/0057317 A1 | 3/2011 | Koike et al. | |
| 2011/0089393 A1 | 4/2011 | Kuo-Pin et al. | |
| 2011/0207318 A1 | 8/2011 | Usami | |
| 2011/0281417 A1 | 11/2011 | Gordon et al. | |
| 2012/0115302 A1 | 5/2012 | Breitwisch et al. | |
| 2012/0156857 A1 | 6/2012 | Cohen | |
| 2012/0178235 A1 | 7/2012 | Pachamuthu et al. | |
| 2012/0205804 A1* | 8/2012 | McFeely | H01L 23/53238 257/751 |
| 2013/0072019 A1 | 3/2013 | Ryan | |
| 2013/0109148 A1 | 5/2013 | Oh et al. | |
| 2013/0241037 A1 | 9/2013 | Jeong et al. | |
| 2013/0264533 A1 | 10/2013 | Cheong et al. | |
| 2014/0029181 A1 | 1/2014 | Gstrein | |
| 2014/0264747 A1 | 9/2014 | Barabash | |
| 2014/0264896 A1 | 9/2014 | Wei et al. | |
| 2014/0327140 A1 | 11/2014 | Zhang et al. | |
| 2015/0111374 A1 | 4/2015 | Bao et al. | |
| 2015/0132901 A1 | 5/2015 | Wang et al. | |
| 2015/0137113 A1 | 5/2015 | Yu et al. | |
| 2015/0170956 A1 | 6/2015 | Naik et al. | |
| 2015/0279736 A1 | 10/2015 | Hotta et al. | |
| 2015/0287675 A1 | 10/2015 | Shaviv | |
| 2015/0325622 A1 | 11/2015 | Zhang et al. | |
| 2015/0357439 A1 | 12/2015 | Liu et al. | |
| 2015/0364420 A1 | 12/2015 | Mei et al. | |
| 2015/0371896 A1 | 12/2015 | Chen et al. | |
| 2016/0049427 A1 | 2/2016 | Zang | |
| 2016/0056074 A1 | 2/2016 | Na | |
| 2016/0056104 A1 | 2/2016 | Bouche et al. | |
| 2016/0068710 A1 | 3/2016 | Wang et al. | |
| 2016/0093635 A1 | 3/2016 | Rabkin et al. | |
| 2016/0111342 A1 | 4/2016 | Huang et al. | |
| 2016/0133563 A1* | 5/2016 | Ai | C23C 16/04 438/628 |
| 2016/0141416 A1 | 5/2016 | Mariani et al. | |
| 2016/0163587 A1 | 6/2016 | Backes et al. | |
| 2016/0163640 A1* | 6/2016 | Edelstein | H01L 21/76811 257/751 |
| 2016/0190008 A1 | 6/2016 | Chandrashekar et al. | |
| 2016/0190009 A1 | 6/2016 | Wallace et al. | |
| 2016/0260779 A1 | 9/2016 | Kawashima et al. | |
| 2017/0076945 A1 | 3/2017 | Hudson | |
| 2017/0077037 A1 | 3/2017 | Kelly et al. | |
| 2017/0186849 A1 | 6/2017 | Chen et al. | |
| 2017/0263563 A1 | 9/2017 | Dutta et al. | |
| 2017/0317026 A1* | 11/2017 | Briggs | H01L 23/5283 |
| 2017/0338149 A1 | 11/2017 | Lin | |
| 2018/0096847 A1 | 4/2018 | Thompson et al. | |
| 2018/0130671 A1 | 5/2018 | Duan et al. | |
| 2018/0144980 A1 | 5/2018 | Basu et al. | |
| 2018/0323151 A1* | 11/2018 | Briggs | H01L 21/76834 |
| 2018/0358260 A1 | 12/2018 | Roy et al. | |

FOREIGN PATENT DOCUMENTS

| | | |
|---|---|---|
| JP | 2011233922 A | 11/2011 |
| KR | 100223334 B1 | 10/1999 |
| KR | 20000026588 A | 5/2000 |
| KR | 20020020969 A | 3/2002 |
| WO | 2016/106092 A1 | 6/2016 |
| WO | 2017136577 A1 | 8/2017 |

OTHER PUBLICATIONS

PCT International Search Report and Written Opinion in PCT/US2017/053936 dated Jan. 12, 2018, 10 pages.
PCT International Search Report and Written Opinion in PCT/US2017/059737 dated May 18, 2018, 11 pages.
PCT International Search Report and Written Opinion in PCT/US2017/060367 dated Feb. 22, 2018, 9 pages.
PCT International Search Report and Written Opinion in PCT/US2017/060368 dated Jan. 31, 2018, 11 pages.
PCT International Search Report and Written Opinion in PCT/US2018/019146 dated May 23, 2018, 12 pages.
PCT International Search Report and Written Opinion in PCT/

(56) References Cited

OTHER PUBLICATIONS

US2018/027284 dated Aug. 2, 2018, 10 pages.
PCT international Search Report and Written Opinion in PCT/US2018/036690 dated Sep. 18, 2018, 9 pages.
PCT International Search Report and Written Opinion in PCT/US2018/048503 dated Dec. 14, 2018, 10 pages.
PCT International Search Report and Written Opinion in PCT/US2018/048504 dated Dec. 13, 2018, 10 pages.
PCT International Search Report and Written Opinion in PCT/US2018/048509 dated Dec. 13, 2018, 10 pages.
PCT ISR & Written Opinion for PCT/US2018/026026, dated Jul. 26, 2018, 11 pages.

* cited by examiner

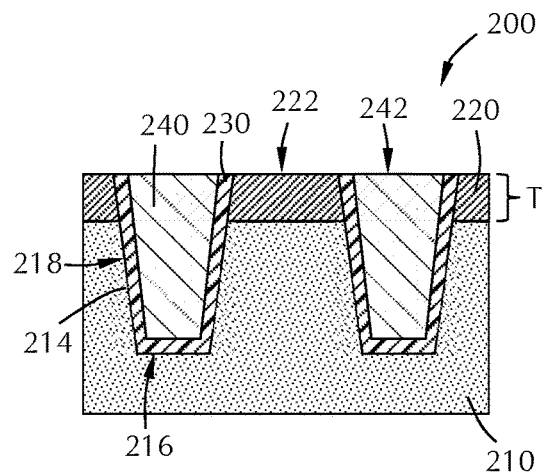
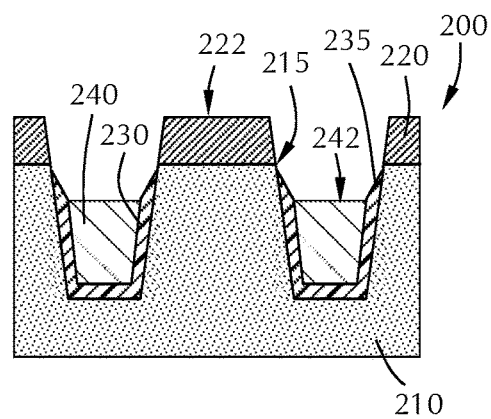
FIG. 4A  FIG. 4B
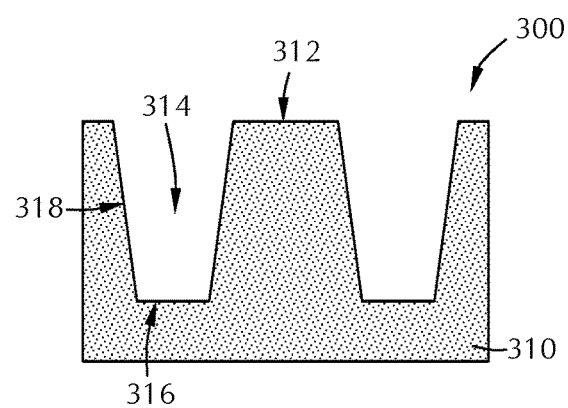
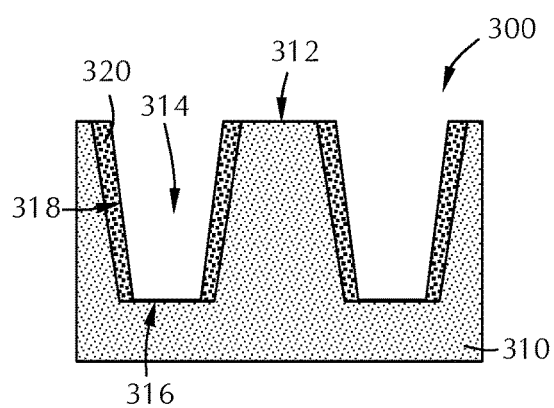
FIG. 5A  FIG. 5B
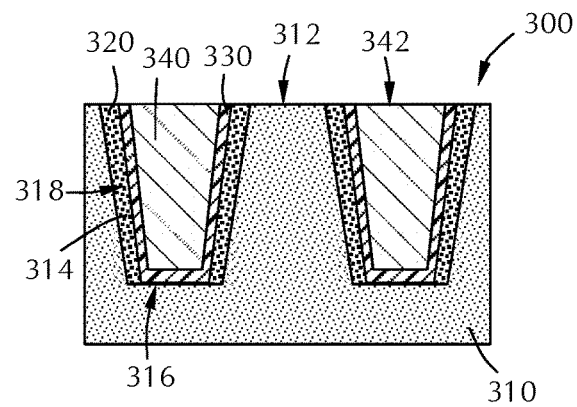
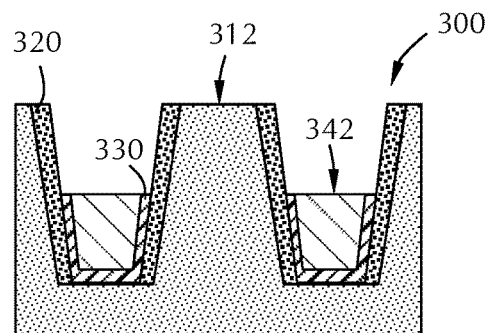
FIG. 5C  FIG. 5D

METHODS FOR CONTROLLABLE METAL AND BARRIER-LINER RECESS

CROSS-REFERENCE TO RELATED APPLICATIONS

This application claims priority to U.S. Provisional Application No. 62/596,113, filed Dec. 7, 2017, the entire disclosure of which is hereby incorporated by reference herein.

TECHNICAL FIELD

The present disclosure relates generally to methods for recessing metal and barrier/liner materials. In particular, the disclosure related to methods to controllably recess the metal and barrier/liner materials as part of a patterning process.

BACKGROUND

Metal-based liners or blocking layers are often used between dielectric layers and metal layers. These liners are frequently used in deposition-etch schemes used for producing self-aligned vias. In use, the metal layer is frequently etched or recessed to remove at least some of the metal layer. However, the liner is often unaffected by the etch process or becomes exposed on the sidewall surfaces after the metal layer is recessed.

In some processes, the liner is only partially etched, leaving liner material on the sidewalls. A longer etch time may decrease the amount of material left on the sidewalls. However, longer etch times can have a disparate etch result on features of different widths. For example, wider features tend to etch more than narrower features. As the size of the features can vary due to many factors, including process irregularity, the different etch depths can cause additional non-uniformity. Additionally, many etch processes for barrier layer removal can damage metal or dielectric layers.

Therefore, there is a need in the art for improved methods of recessing metal layers and metal-based liners.

SUMMARY

One or more embodiments of the disclosure are directed to processing methods comprising providing a substrate with a first dielectric material with a second dielectric material formed thereon. The second dielectric material has a thickness. The substrate comprises at least one feature formed in the first dielectric material and the second dielectric material. The at least one feature has at least one sidewall and a bottom. A depth of the feature is defined from a top surface of the second dielectric material to the bottom of the feature. A barrier layer is formed on the at least one sidewall and the bottom. A metal layer is formed on the barrier layer to fill the depth of the at least one feature. The metal layer and the barrier layer are etched to decrease a depth of the metal layer to a recessed depth and remove the barrier layer from the sidewall of the second dielectric material.

Additional embodiments of the disclosure are directed to processing methods comprising providing a substrate comprising a dielectric material with at least one feature formed thereon. The at least one feature has at least one sidewall and a bottom. A distance from a surface of the dielectric material to the bottom of the feature defines a depth of the feature. The dielectric material is passivated at the sidewall of the feature to form a passivated dielectric layer. A barrier layer is formed on the at least one sidewall on the passivated dielectric layer and the bottom of the at least one feature. A metal layer is deposited in the feature to fill the at least one feature. A portion of the metal layer and the barrier layer is removed to a predetermined depth and remove the barrier layer from the passivated dielectric layer.

Further embodiments of the disclosure are directed to processing methods comprising providing a substrate comprising a dielectric material. The substrate has at least one feature with at least one sidewall and a bottom defining a volume. A barrier layer is formed on the at least one sidewall and the bottom. A metal layer is formed on the barrier layer to fill the volume of the at least one feature. The metal layer is etched to expose a portion of the barrier layer within the feature. The exposed portion of the barrier layer is etched to remove the exposed portion of the barrier layer. Etching the metal layer and etching the barrier layer is repeated until a predetermined depth of the metal layer has been removed.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 4A and 4B show a cross-sectional schematic view of a metal recessing process in accordance with one or more embodiment of the disclosure;

FIGS. 5A through 5D show a cross-sectional schematic view of a metal recessing process in accordance with one or more embodiment of the disclosure.

DETAILED DESCRIPTION

Figure 1:
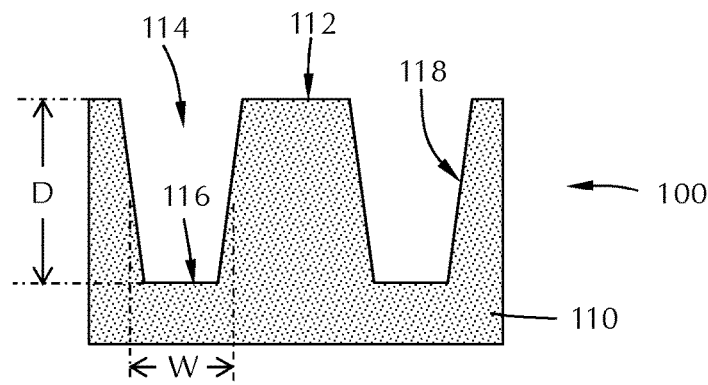
FIG. 1 shows a schematic cross-sectional view of a substrate with features formed therein in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

Conventional metal recess is selective relative to the metal barrier layers resulting in the formation of "ears" of the barrier layer above the top of the metal layer. Metal recess processes with long process times to a target recess depth results in micro-loading in which wider features have a greater amount of etching than smaller features. The loading effect is progressively worse with longer process times. Additionally, metal barrier recess processes tend to attack the core metal causing damage.

Accordingly, one or more embodiments of the disclosure advantageously provide methods for recessing a metal layer and a metal-containing liner to about the same height. Some embodiments of the disclosure advantageously provide methods of recessing metal layers and barrier layers without unduly damaging the metal or adjacent dielectric layers. Some embodiments of the disclosure advantageously provide methods to rapidly and uniformly remove metal and liner layers. Some embodiments of the disclosure provide methods of recessing a metal layer and metal-containing barrier layer to a predetermined depth with minimal damage to the core metal and minimal micro-loading effects.

One or more embodiments of the disclosure provide methods that use an additional dielectric layer with different surface adhesion to improve the etch rate of a liner. Some embodiments provide methods that use selective passivation (e.g., by UV or plasma) of dielectric surfaces (i.e., features sidewalls) to modify surface adhesion on passivated surfaces. Some embodiments of the disclosure provide methods of cyclically etching the metal and barrier layers.

Some embodiments of the disclosure provide methods and approaches for interconnect integration schemes to recess metal and barriers to the same height by: (1) using sequential recess of core metal (Co or Cu) recess followed by metal barrier recess (TiN or TaN/Co/Ru); (2) exposing the core metal to wet chemistry containing peroxide and formulated chemicals at room temperature and acid pH levels to be selective to the core metal; (3) metal barrier recess wet chemistry containing peroxide and ammonium hydroxide at 30-60° C. adjusted to alkaline pH levels to be selective to the core metal. To facilitate the barrier layer removal efficiency, an ultra low-k sidewall dielectric can be treated by one or more of (a) surface nitridation by N2/NH3 plasma post dielectric etch; (b) thin (e.g., 5-30 Å) conformal nitrogen-rich film deposition and via bottom etch through; (c) other surface passivating films such as AlN, AlON, AlO, SiCN, SiOC, SiOCN or combinations thereof that seal the ultra low-k surface pores and help with barrier recess; (d) UV pore sealing by (dimethylamino)dimethylsilane (DMADMS) and similar precursors in elevated temperature (200-400° C.) using broadband UV; and (e) use of nitride dielectric cap to make the top portion of the recess front different.

FIG. 1 illustrates a substrate 100 comprising a dielectric material 110 with at least one feature 114 formed therein. The feature 114 forms an opening in the top surface 112 of the dielectric material 110. The feature 114 extends from the top surface 112 to a depth D to a bottom 116. The feature 114 has at least one sidewall 118 that define a width W of the feature 114. The open area formed by the at least one sidewall 118 and bottom 116 is also referred to as a gap. The gap formed by the at least one sidewall 118 and the bottom 116 has a volume, measured to a plane at the level of the top surface 112 of the dielectric material 110. The feature 114 illustrated in FIG. 1 has sidewalls 118 that slope inwardly so that the width at the bottom 116 of the feature 114 is smaller than the width at the feature 114 at the top surface 112. This is merely representative of one possible configuration and should not be taken as limiting the scope of the disclosure. The shape of the features 114 can be cylindrical, conical, truncated conical, inverted conical, truncated inverted conical (as shown), trenches, or other shapes.

The width W of the feature is measured as the average width between sidewalls as a function of the depth in the feature 114 measured from the top surface 112. The embodiment illustrated in FIG. 1 shows a substrate 100 comprising a dielectric material 110 that forms the boundaries of the top surface 112, bottom 116 and sidewalls 118 of the features 114. However, those skilled in the art will recognize that the sidewalls 118 and bottom 116 of the feature 114 can be bounded by different materials. As used in this manner, the term "bounded" refers to the material on the sides and/or bottom of the stated component. For example, the embodiment illustrated in FIG. 2A has a bottom 116 of the feature 114 be defined by a conductive material 120 while the sidewalls 118 of the feature 114 are defined by a dielectric material 110. The opposite arrangement of materials can also be used.

Figures 2A, 2B:
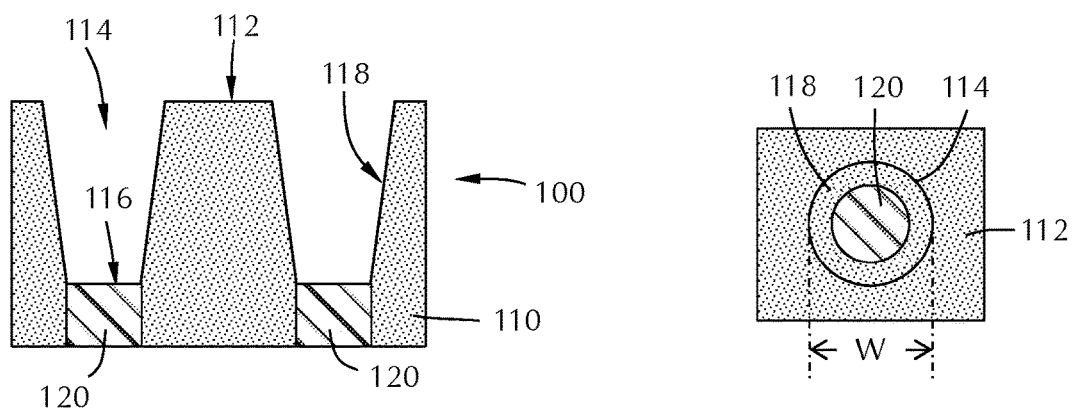
FIG. 2A shows a schematic cross-sectional view of a substrate with different materials and features formed over one of the material in accordance with one or more embodiment of the disclosure.
FIG. 2B shows a top view of the substrate of FIG. 2A.

The feature 114 of some embodiments is a via. When viewed from the top surface 112, as shown in FIG. 2B, the feature 114 appears as a circular or oval shaped opening. The feature 114 of FIG. 2B has one sidewall 118 that is a continuous section of material. The width W of this type of feature 114 is measured as the average width or diameter across the feature 114.

Figures 3A, 3B:
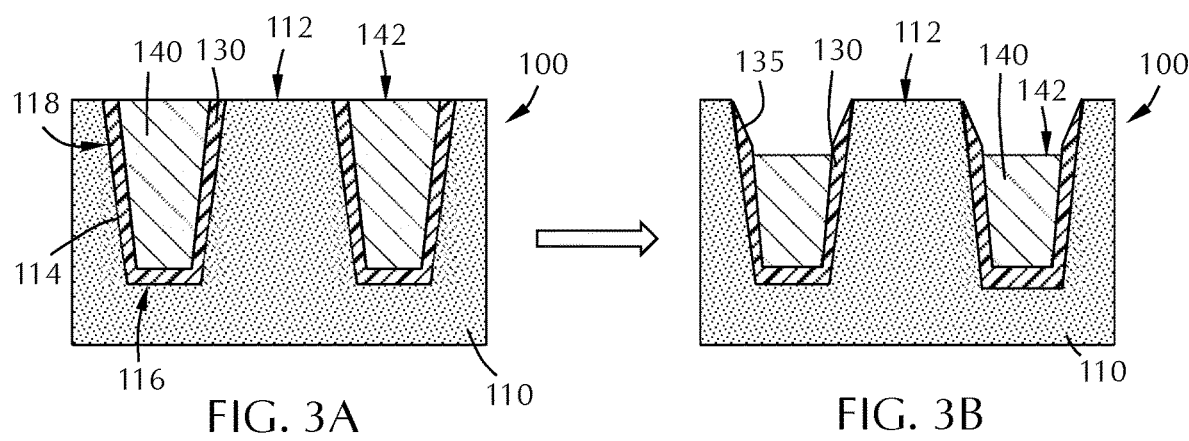
FIGS. 3A and 3B show a cross-sectional schematic view of a metal recessing process in accordance with one or more embodiment of the disclosure.

FIGS. 3A and 3B illustrate a conventional etch process to recess a metal layer 140 in a feature 114 formed in a dielectric material 110. The feature 114 illustrated in FIG. 3A includes a barrier layer 130 that lines the sidewall 118 and bottom 116 of the feature 114. A metal layer 140 fills the volume of the feature 114 to a top surface 142 that is about coplanar with the top surface 112 of the dielectric material 110. After exposing the substrate 100 to an etch process, as shown in FIG. 3B, the top surface 142 of the metal layer 140 is recessed below the top surface 112 of the dielectric material 110. The etch process also removes some of the barrier layer 130, leaving barrier layer residue 135 on the sidewalls 118 between the top surface 142 of the recessed metal layer 140 and the top surface 112 of the dielectric material 110. The barrier layer residue 135 is also referred to as "ears".

Referring to FIGS. 4A and 4B, one or more embodiments of the disclosure are directed to processing methods to recess a metal layer. A substrate 200 is provided that has a first dielectric material 210 with a second dielectric material 220 deposited thereon. The second dielectric material 220 has a thickness T. The substrate 200 includes at least one feature 214 formed in the first dielectric material 210 and through the second dielectric material 220. The feature 214 has at least one sidewall 218 and a bottom 216. The sidewall 218 is bounded by the second dielectric material 220 near the top surface 222 of the second dielectric material 220. Stated differently, the sidewall 218 is bounded by the second dielectric material 220 through the thickness T of the second dielectric material 220 and by the first dielectric material 210 below the thickness T of the second dielectric material 220. The depth of the feature is defined from the top surface 222 of the second dielectric material 220 to the bottom 216 of the feature.

The width and depth of the feature 214 can vary. The aspect ratio (depth:width) of the feature can be any suitable aspect ratio. In some embodiments, the aspect ratio of the feature 214 is in range of 0.5:1 up to 20:1, with typical range of 1:1-4:1.

The thickness T of the second dielectric material 220 can be any suitable thickness. In some embodiments, the thickness T of the second dielectric material 220 is in the range of about 5% to about 90% of the depth of the feature 214, or in the range of about 5% to about 70% of the depth of the feature 214, or in the range of about 5% to about 50% of the depth of the feature 214, or in the range of about 10% to about 30% of the depth of the feature 214.

The second dielectric material 220 is different than the first dielectric material 210 in one or more of composition and physical properties. In some embodiments, the second dielectric material 220 can be a different composition than the first dielectric material 210. In some embodiments, the first dielectric material 210 and the second dielectric material 220 are the same composition but the second dielectric material 220 is denser and/or less porous than the first dielectric material. 210. In some embodiments, the second dielectric material 220 has different adhesion properties (relative to the barrier layer 230) than the first dielectric material 210.

The first dielectric material 210 can be any suitable material. In some embodiments, the first dielectric material 210 comprises silicon oxycarbide (SiOC), porous organosilicate glass (p-SiCOH), doped or undoped silicate glass, silicon oxide (SiOx).

The second dielectric material 220 can be any suitable material. In some embodiments, the second dielectric material comprises one or more of SiN, SiCN, SiOC, AlOx, AlN, AlC or combination of above. The skilled artisan will recognize that the use of terms like "SiN" do not indicate stoichiometric amounts of the stated elements; rather, the term "SiN" means that the material has silicon and nitrogen atoms.

A barrier layer 230 is formed on the at least one sidewall 218 and the bottom 216 of the feature 214. The barrier layer 230 on the sidewall 218 of the feature 214 is bounded by the second dielectric material 220 near the top surface 222 of the second dielectric material 220 through the thickness T of the second dielectric material 220. The barrier layer 230 on the sidewall 218 is also bounded by the first dielectric material 210 below the thickness T of the second dielectric material 220.

The barrier layer 230 can include any suitable components. In some embodiments, the barrier layer 230 comprises one or more of titanium nitride (TiN) or tantalum nitride (TaN). In some embodiments, the barrier layer 230 includes a liner material (not shown) as either a separate layer or mixed with the barrier layer 230. The liner of some embodiments is one or more of cobalt (Co) or ruthenium (Ru). In some embodiments, the barrier layer comprises tantalum nitride (TaN) with a cobalt (Co) or ruthenium (Ru) liner. The barrier layer can also comprise aluminum-containing compounds (including metallic Al) or manganese-containing compounds (including metallic Mn).

A metal layer 240 is deposited on the barrier layer 230 to fill the depth of the at least one feature 214. Stated differently, the volume of the feature 214 is filled with the barrier layer 230 and the metal layer 240. The metal layer 240 can be deposited in the feature 214 by any suitable technique known to the skilled artisan.

The metal layer 240 can include any suitable metal. In some embodiments, the metal layer 240 comprises one or more of cobalt (Co), copper (Cu), tungsten (W), ruthenium (Ru), nickel (Ni), noble metals (Ir, Pt), alloys or compound conductors (e.g. NiSi). In some embodiments, the metal layer 240 comprises Co and the barrier layer 230 comprises TiN. In some embodiments, the metal layer 240 comprises Cu and the barrier layer 230 comprises TaN with a liner comprising one or more of Co or Ru.

As shown in FIG. 4B, after etching, the metal layer 240 has been recessed to a recessed depth. The top surface 242 of the metal layer 240 at the recessed depth is below the top surface 222 of the second dielectric material 220. In some embodiments, the metal layer 240 has been recessed so that the top surface 242 of the metal layer 240 is below the thickness T of the second dielectric material 220, or below the interface 215 between the second dielectric material 220 and the first dielectric material 210.

The etch process may also remove the barrier layer 230 from the sidewall 218 of the second dielectric material 220. Some barrier layer residual 235 may remain in contact with the first dielectric material 210. The barrier layer residual 235 that might remain is below the top surface 222 of the second dielectric material 220.

In some embodiments, the etch process comprises a cyclical or sequential process to selectively etch the metal layer 240 and to selectively etch the barrier layer 230. In some embodiments, the sequential metal layer 240 etch and barrier layer 230 etch processes are repeated.

The etch process can be any suitable etch process known to the skilled artisan. The etch process may also be referred to as core metal recessing. In some embodiments, etching the metal layer 240, or core metal recessing, comprise a wet chemical method in which peroxide ($H_2O_2$) is exposed to the metal layer 240 at acidic pH at about room temperature (i.e., in the range of about 20° C. to about 100° C.). In some embodiments, etching of the barrier layer 230 comprises exposes the substrate to a mixture of peroxide ($H_2O_2$) and ammonium hydroxide ($NH_4OH$) at a temperature in the range of about 30° C. to about 80° C. with an alkaline pH level.

Some embodiments of the disclosure are directed to semiconductor devices comprising a substrate 200 with a first dielectric material 210 and a second dielectric material 220 thereon. The substrate 200 has at least one feature 214 formed in the first dielectric material 210 and through the second dielectric material 220. The feature 214 having at least one sidewall 218 and a bottom 216. The at least one sidewall 218 bounded by the second dielectric material 220 and the first dielectric material 210.

The semiconductor device includes a barrier layer 230 located within the feature 214 so that the barrier layer 230 is on the sidewall 218 bounded by the first dielectric material 210. In some embodiments, the barrier layer 230 is substantially only bounded by the first dielectric material 210. In some embodiments, the barrier layer 230 is not on the sidewall 218 of the feature 214 bounded by the second dielectric material 220. The barrier layer 230 of some embodiments is a substantially conformal film on the sidewalls 218 and bottom 216 of the feature 214. As used in this manner, a "conformal film" means that the thickness of the film at any point is within ±10%, ±5%, ±2% or ±1% of the average thickness of the film.

A metal layer 240 is within the feature 214 bounded by the barrier layer 230. In some embodiments, the metal layer 240 has barrier layer 230 on the sides and bottom of the metal layer 240. In some embodiments, the metal layer 240 has barrier layer 230 on the sides of the metal layer. In some embodiments, the top surface 242 of the metal layer 240 is even with or below the top of the barrier layer 230. In some embodiments, the barrier layer residual 235 is above the top surface 242 of the metal layer 240 and below the second dielectric material 220.

FIGS. 5A through 5D illustrate another embodiment of the disclosure. Here a substrate 300 is provided that has a dielectric material 310 with a top surface 312 and at least one feature 314 formed therein. The feature 314 has a sidewall 318 and a bottom 316 which define a volume of the feature 314. The depth of the feature 314 is defined by the distance from the top surface 312 of the dielectric material 310 to the bottom 316 of the feature 314.

The substrate 300 can be subject to a passivation process to form the substrate 300 shown in FIG. 5B. The passivation process passivates the dielectric material 310 at the sidewall 318 of the feature 314 to form a passivated dielectric layer 320. The passivation process can be any suitable process that can change the properties of the dielectric material 310 at the sidewalls 318. Suitable passivation methods include, but are not limited to, scalable physical films formed at the sidewall, sidewall treatments to reduce the capacitance penalty while maintaining the composition or a gradient treatment to modify the top portion of the sidewall to a depth of the recess thickness. In some embodiments, passivating the dielectric material 310 comprises one or more of UV or plasma exposure. In some embodiments, passivating the dielectric material 310 comprises forming a nitride. In some embodiments, passivating the dielectric material 310 comprises treating the sidewall 318 of the at least one feature 314 so that the adhesion of the barrier layer 330 on the passivated dielectric layer 320 is lower than the adhesion of the barrier layer 330 on the dielectric material 310.

Referring to FIG. 5C, a barrier layer 330 can be formed on the sidewalls 318 and bottom 316 of the feature 314. The barrier layer 330 covers the passivated dielectric layer 320 on the sidewalls 318. The barrier layer 330 can be formed by any suitable technique including, but not limited to, conformal atomic layer deposition (ALD) followed by chemical-mechanical planarization to remove deposition from the top surface 312 of the dielectric material 310.

The feature 314 can then be gapfilled with a metal layer 340 so that the top surface 342 of the metal layer 340 is about even with the top surface 312 of the dielectric material 310. The metal layer 340 can be deposited by any suitable technique including, but not limited to, blanket deposition followed by chemical-mechanical planarization.

In some embodiments, passivating the dielectric material 310 at the sidewall 318 of the feature 314 forms a gradient passivated dielectric layer 320 so that a portion of the sidewall 318 from the top surface 312 of the dielectric material 310 to a predetermined depth is modified so that removal of a barrier layer from the passivated dielectric layer 320 is easier than removal of the barrier layer from the dielectric material 310. In some embodiments, the predetermined depth of the gradient passivation is about the same as the predetermined depth of that the metal layer 340 will be recessed to.

As shown in FIG. 5D, after etching, the metal layer 340 has been recessed to a predetermined recessed depth. The top surface 342 of the metal layer 340 at the recessed depth is below the top surface 312 of the dielectric material 310. The etch process may also remove the barrier layer 330 from the passivated dielectric layer 320.

In some embodiments, the etch process comprises a cyclical or sequential process to selectively etch the metal layer 340 and to selectively etch the barrier layer 330. In some embodiments, the sequential metal layer 340 etch and barrier layer 330 etch processes are repeated.

The etch process can be any suitable etch process known to the skilled artisan. The etch process may also be referred to as core metal recessing. In some embodiments, etching the metal layer 340, or core metal recessing, comprise a wet chemical method in which peroxide ($H_2O_2$) is exposed to the metal layer 340 at acidic pH at about room temperature (i.e., in the range of about 20° C. to about 100° C.). In some embodiments, etching of the barrier layer 330 comprises exposes the substrate to a mixture of peroxide ($H_2O_2$) and ammonium hydroxide ($NH_4OH$) at a temperature in the range of about 30° C. to about 80° C. with an alkaline pH level.

Some embodiments of the disclosure are directed to semiconductor devices comprising a substrate 300 with a dielectric material 310 having at least one feature 314 formed therein. The at least one feature 314 having at least one sidewall 318 and a bottom 316. The substrate 300 has a passivated dielectric layer 320 forming at least a portion of the sidewall 318. In some embodiments, the passivated dielectric layer 320 is formed at a top portion of the sidewall 318 near the top surface 312 of the dielectric material 310 and does not extend to the bottom 316 of the feature.

The semiconductor device includes a barrier layer 330 located within the feature 314 so that the barrier layer 330 is on the sidewall 318 bounded by the dielectric material 310 or the passivated dielectric layer 320. In some embodiments, the barrier layer 330 is substantially only bounded by the passivated dielectric layer 320. The barrier layer 330 of some embodiments is a substantially conformal film on the sidewalls 318 and bottom 316 of the feature 314.

A metal layer 340 is within the feature 314 bounded by the barrier layer 330. In some embodiments, the metal layer 340 has barrier layer 330 on the sides and bottom of the metal layer 340. In some embodiments, the metal layer 340 has barrier layer 330 on the sides of the metal layer. In some embodiments, the top surface 342 of the metal layer 340 is even with or below the top of the barrier layer 330.

Figure 6A:
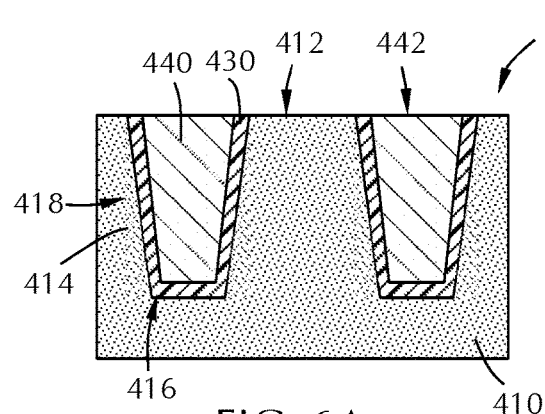
FIGS. 6A through 6F show a cross-sectional schematic view of a metal recessing process in accordance with one or more embodiment of the disclosure.

FIGS. 6A through 6F illustrate another embodiment of the disclosure. FIG. 6A illustrates a substrate 400 that can be used with the processes described herein. The substrate 400 has a dielectric material 410 with a top surface 412. At least one feature 414 is formed in the dielectric material 410. The feature 414 has a bottom 416 and at least one sidewall 418, as described above. A barrier layer 430 is formed on the bottom 416 and sidewall 418 of the feature 414 and a metal layer 440 is gapfilled on the barrier layer 430 to fill the feature 414.

Figure 6B:
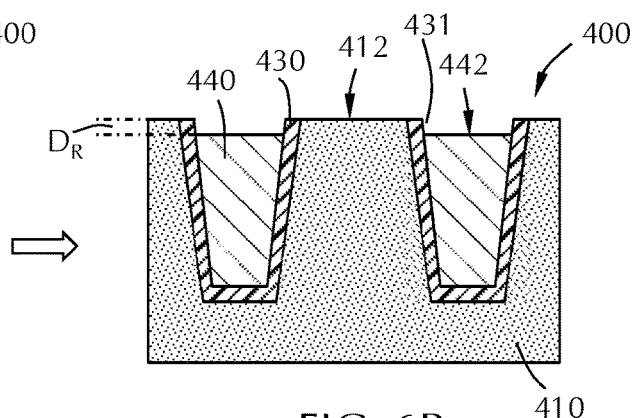

In FIG. 6B, the substrate 400 has been exposed to an etching process to remove a portion of the metal layer 440 to lower the top surface 442 of the metal layer 440 relative to the top surface 412 of the dielectric material 410. The metal layer 440 is etched by a recess depth $D_R$ by any suitable amount. In some embodiments, the recess depth $D_R$ is less than one monolayer of metal atoms thick. In some embodiments, the recess depth $D_R$ is in the range of about 1 Å to about 100 Å.

Figure 6D:
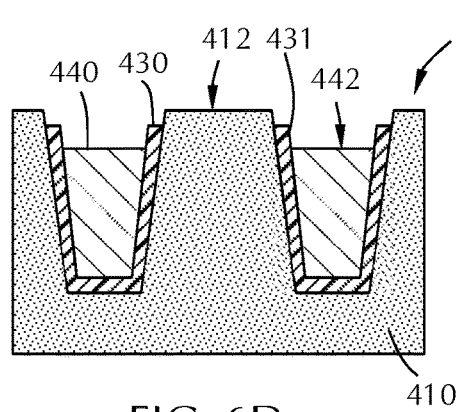
Figure 6C:
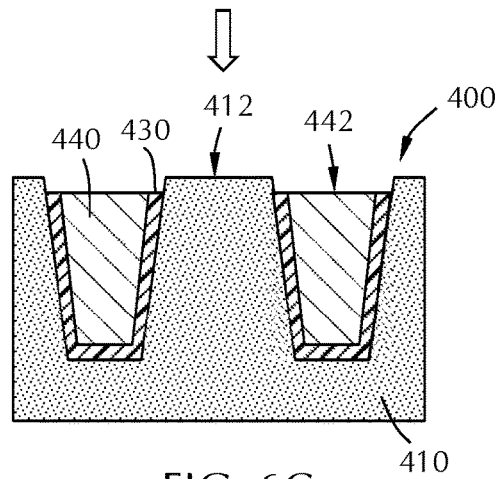
Figure 6E:
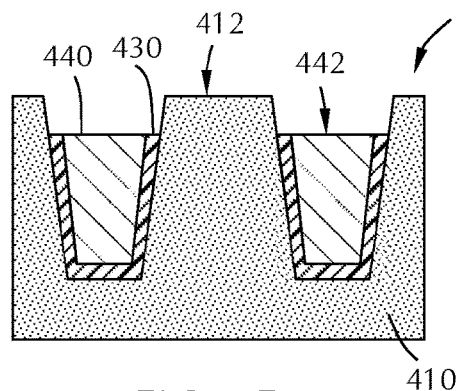
Figure 6F:
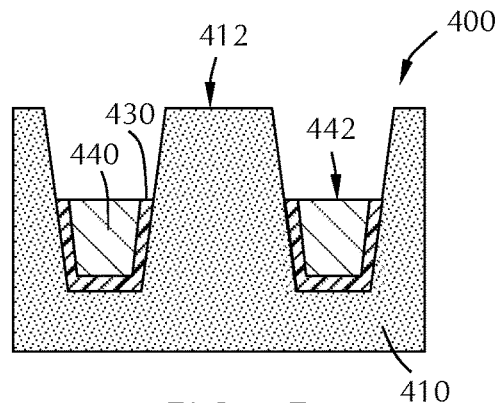

The etching process exposes a portion 431 of the barrier layer 430 above the top surface 442 of the recessed metal layer 440. In FIG. 6C, the exposed portion 431 of the barrier layer 430 is etched to lower the top of the barrier layer to the top surface 442 of the metal layer 440. FIGS. 6D and 6E show a repetition of the metal layer 440 etch followed by the barrier layer 430 etch until a predetermined depth of the metal layer 440 has been removed and the top surface 442 of the metal layer 440 is at a predetermined depth, as shown in FIG. 6F.

Some embodiments of the disclosure are directed to semiconductor devices comprising a substrate 400 with a dielectric material 410 having at least one feature 414 formed therein. The at least one feature 414 having at least one sidewall 418 and a bottom 416.

The semiconductor device includes a barrier layer 430 located within the feature 414 so that the barrier layer 430 is on a portion of the sidewall 418 bounded by the dielectric material 410. In some embodiments, the barrier layer 430 is substantially only bounded by the dielectric material 410. The barrier layer 430 of some embodiments is a substantially conformal film on the sidewalls 418 and bottom 416 of the feature 414.

A metal layer 440 is within the feature 414 bounded by the barrier layer 430. In some embodiments, the metal layer 440 has barrier layer 430 on the sides and bottom of the metal layer 440. In some embodiments, the metal layer 440 has barrier layer 430 on the sides of the metal layer 440. In some embodiments, the top surface 442 of the metal layer 440 is substantially even with the top of the barrier layer 430. As used in this manner, the term "substantially even with" means that the top of the metal layer is even with the top of the barrier layer within ±10 Å, ±5 Å, ±4 Å, ±3 Å, ±2 Å or ±1 Å. In some embodiments, the top of the barrier layer 430 is below the top surface 442 of the metal layer 440.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
providing a substrate comprising a first dielectric material with a second dielectric material deposited thereon, the second dielectric material having a thickness, the substrate comprising at least one feature formed in the first dielectric material and the second dielectric material, the at least one feature having at least one sidewall and a bottom, a depth of the feature defined from a top surface of the second dielectric material to the bottom of the feature, a barrier layer formed on the at least one sidewall and the bottom, and a metal layer formed on the barrier layer to fill the depth of the at least one feature, the second dielectric material having a higher density than the first dielectric material;
etching the metal layer to expose a portion of the barrier layer and to decrease a depth of the metal layer to a recessed depth;
etching the exposed portion of the barrier layer to remove the exposed portion of the barrier layer from the sidewall of the second dielectric material, wherein a top surface of the metal layer is even with a top of the barrier layer ±10 Å; and
repeating the etching of the metal layer and the etching of the barrier layer until a predetermined depth of the metal layer has been removed.

2. The method of claim 1, wherein the first dielectric material comprises one or more of SiOC, porous organosilicate glass (p-SiCOH), doped or undoped silicate or SiOx.

3. The method of claim 1, wherein the second dielectric material comprises one or more of SiN, SiCN, SiOC, AlN, AlC, AlOx, or a combination thereof.

4. The method of claim 1, wherein the metal layer comprises one or more of Co, Cu, W, Ru, Ni, Ir, Pt or Si.

5. The method of claim 1, wherein the barrier layer comprises a TiN.

6. The method of claim 1, wherein the barrier layer comprises TaN with a Co or Ru liner, or Mn or Al containing compounds.

7. The method of claim 1, wherein the metal layer comprises Co and the barrier layer comprises TiN.

8. The method of claim 1, wherein the metal layer comprises Cu and the barrier layer comprises TaN with a liner comprising one or more of Co or Ru.

* * * * *